(12) United States Patent
Iwatani et al.

(10) Patent No.: US 8,159,093 B2
(45) Date of Patent: Apr. 17, 2012

(54) MOTOR APPARATUS, MANUFACTURING METHOD, EXPOSURE APPARATUS, AND DEVICE FABRICATION METHOD

(75) Inventors: Satoshi Iwatani, Utsunomiya (JP); Yoshikazu Miyajima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 464 days.

(21) Appl. No.: 12/481,871

(22) Filed: Jun. 10, 2009

(65) Prior Publication Data
US 2009/0315413 A1  Dec. 24, 2009

(30) Foreign Application Priority Data
Jun. 20, 2008 (JP) .................. 2008-162406

(51) Int. Cl.
*H02K 41/02* (2006.01)

(52) U.S. Cl. ............... 310/12.22; 310/12.23; 310/45
(58) Field of Classification Search .... 310/12.22–12.26, 310/45
See application file for complete search history.

(56) References Cited

U.S. PATENT DOCUMENTS

| | | | | |
|---|---|---|---|---|
| 4,187,453 A | * | 2/1980 | Rough | 318/135 |
| 4,758,750 A | * | 7/1988 | Itagaki et al. | 310/13 |
| 5,808,381 A | * | 9/1998 | Aoyama et al. | 310/12.29 |
| 6,226,073 B1 | * | 5/2001 | Emoto | 355/53 |
| 6,266,133 B1 | * | 7/2001 | Miyajima et al. | 355/72 |
| 6,320,649 B1 | * | 11/2001 | Miyajima et al. | 355/72 |
| 6,836,031 B2 | | 12/2004 | Emoto et al. | |
| 2002/0081528 A1 | | 6/2002 | Miyajima et al. | 430/302 |
| 2002/0180280 A1 | * | 12/2002 | Hsiao | 310/12 |
| 2004/0222705 A1 | * | 11/2004 | Uchida | 310/12 |
| 2005/0285451 A1 | * | 12/2005 | Kubo et al. | 310/12 |

FOREIGN PATENT DOCUMENTS

JP 2006-141080 6/2006

* cited by examiner

*Primary Examiner* — Thanh Lam
(74) *Attorney, Agent, or Firm* — Fitzpatrick, Cella, Harper & Scinto

(57) ABSTRACT

A motor apparatus includes a movable portion including a coil and a tooth-like salient pole and a platen opposed to the movable portion. The movable portion and the platen move relative to each other by using a magnetic field generated by supplying a current to the coil. The platen includes a base material having a surface on which convex portions and first concave portions are periodically arranged, a first thermally sprayed layer formed on the surface of the base material by thermal spraying such that second concave portions are formed inside the first concave portions, and a resin filled in the second concave portions.

20 Claims, 12 Drawing Sheets

F I G. 4
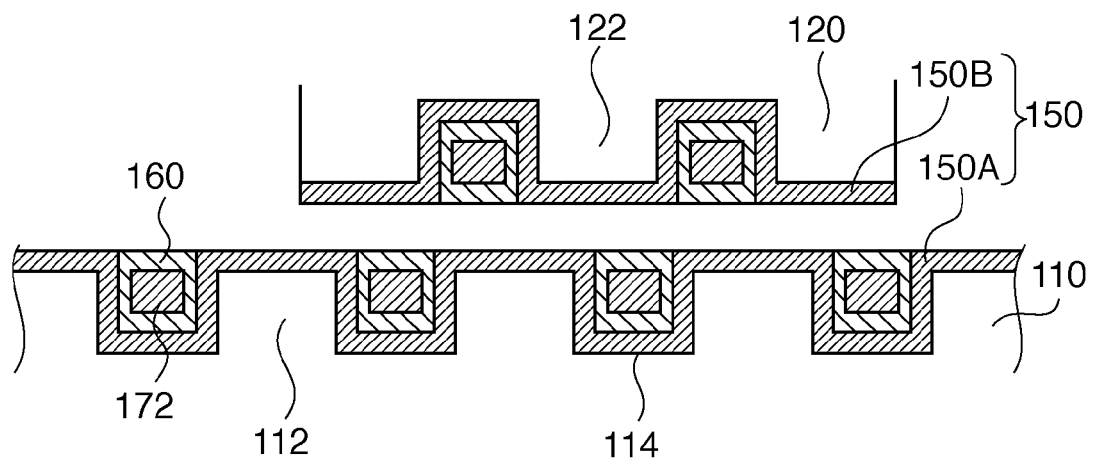
F I G. 5
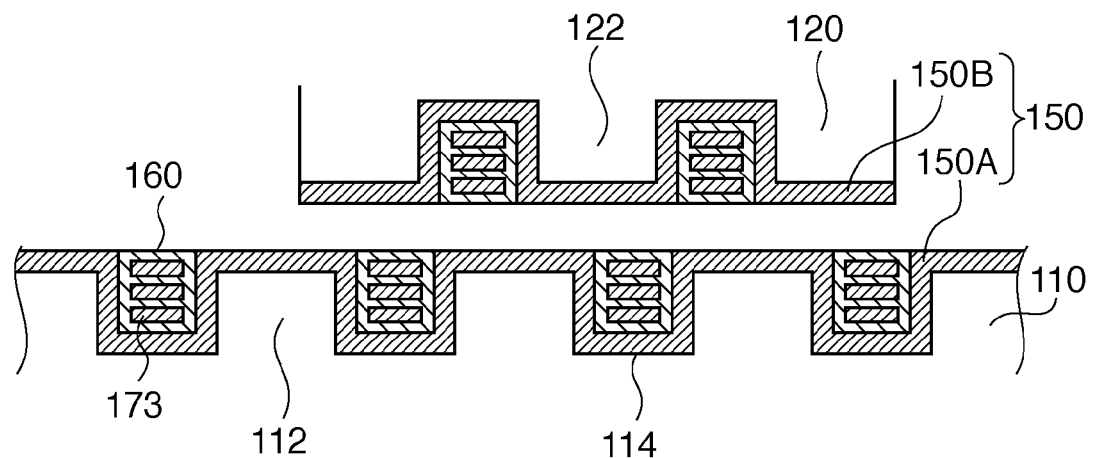

2020

MOTOR APPARATUS, MANUFACTURING METHOD, EXPOSURE APPARATUS, AND DEVICE FABRICATION METHOD

BACKGROUND OF THE INVENTION

1. Field of the Invention

The present invention relates to a motor apparatus, manufacturing method, exposure apparatus, and device fabrication method.

2. Description of the Related Art

A projection exposure apparatus has conventionally been used when manufacturing a fine semiconductor device such as a semiconductor memory or logic circuit by using the photolithography technique. In the projection exposure apparatus, a projection optical system projects patterns (circuit patterns) formed on a reticle (mask) onto a substrate such as a wafer, thereby transferring the circuit patterns. Note that the projection exposure apparatus includes a reticle stage and wafer stage for respectively sequentially moving the reticle and wafer relative to the projection optical system by using a linear pulse motor or dual-axis pulse motor when projecting the reticle patterns onto the wafer.

An outline (the arrangement and operation principle) of the linear pulse motor will be explained below with reference to FIGS. 13A to 13D and 14.

In FIGS. 13A to 13D, reference numeral 1010 denotes a platen that is a stator of the linear pulse motor, and has periodical convex portions (platen convex portions) 1012 and concave portions (platen concave portions) 1014 on the surface. Note that the platen convex portions 1012 are arranged at a predetermined interval $\tau$ on the platen 1010. Reference numeral 1020 denotes a movable portion having movable-portion teeth (convex portions) 1022 on the surface. Reference numeral 1030 denotes a coil for magnetizing the movable-portion teeth 1022 by a current. Reference numeral 1040 denotes a permanent magnet that generates attraction between the platen 1010 and movable-portion teeth 1022. Reference numerals 1051, 1052, 1053, and 1054 respectively denote first, second, third, and fourth salient poles that generate magnetic attraction by the coils 1030. Reference symbol MF denotes a magnetic flux generated by the currents flowing through the coils 1030 and the permanent magnet 1040.

FIG. 13A shows a state in which the movable portion 1020 is in an original position. FIG. 13B shows a state in which the movable portion 1020 is in a $\tau/4$ position. FIG. 13C shows a state in which the movable portion 1020 is in a $2\tau/4$ position. FIG. 13D shows a state in which the movable portion 1020 is in a $3\tau/4$ position. The first to fourth salient poles 1051 to 1054 of the movable portion 1020 are spatially shifted by $\tau/4$.

First, when a current is supplied in a direction shown in FIG. 13A to the coil 1030 corresponding to the first salient pole 1051 while the movable portion 1020 is in the original position (FIG. 13A), a magnetic flux passing through the first salient pole 1051 combines with the magnetic flux of the permanent magnet 1040 and becomes maximum. Consequently, the first salient pole 1051 and the platen convex portions 1012 immediately below the first salient pole 1051 attract each other. When a current is supplied in a direction shown in FIG. 13A to the coil 1030 corresponding to the second salient pole 1052, a magnetic flux passing through the second salient pole 1052 cancels the magnetic flux of the permanent magnet 1040. Consequently, the second salient pole 1052 is positioned above the platen concave portions 1014. Also, each of the third and fourth salient poles 1053 and 1054 and the platen convex portions 1012 obliquely attract each other.

Then, the currents supplied to the coils 1030 corresponding to the first and second salient poles 1051 and 1052 are stopped. When currents are supplied in directions shown in FIG. 13B to the coils 1030 corresponding to the third and fourth salient poles 1053 and 1054, a magnetic flux passing through the fourth salient pole 1054 combines with the magnetic flux of the permanent magnet 1040 and becomes maximum. As a result, the fourth salient pole 1054 and the platen convex portions 1012 immediately below the fourth salient pole 1054 attract each other. A magnetic flux passing through the third salient pole 1053 is canceled by the magnetic flux of the permanent magnet 1040, so the third salient pole 1053 and platen convex portions 1012 do not attract each other any longer. Also, each of the first and second salient poles 1051 and 1052 and the platen convex portions 1012 obliquely attract each other.

Thus, the movable portion 1020 moves to the $\tau/2$ position shown in FIG. 13B so as to oppose the fourth salient pole 1054 to the platen convex portions 1012. Similarly, the movable portion 1020 can sequentially be moved to the right by switching the directions of the currents to be supplied to the coils 1030 as shown in FIGS. 13A to 13D.

In the linear pulse motor, a predetermined clearance is generally held between the platen 1010 and movable portion 1020 by an LM guide or an air bearing formed in the movable portion 1020. As shown in FIG. 14, therefore, a non-magnetic epoxy resin ER is filled in the platen concave portions 1014 and between the movable-portion teeth 1022, thereby forming an air-bearing running surface. This air-bearing running surface is required to have high surface accuracy. In the manufacturing process of the platen 1010, therefore, after the epoxy resin ER is filled in the platen concave portions 1014 and cured, the surface (facing the movable portion) of the platen 1010 is ground to secure predetermined surface accuracy. Note that this surface grinding is performed by wet grinding in order to prevent expansion of the epoxy resin ER caused by grinding heat generated by friction between a whetstone of surface grinding and the surface of the platen 1010, thereby preventing deterioration of the surface accuracy. Note also that after the surface of the platen 1010 is ground, the platen convex portions 1012 are normally plated or coated as a rust preventing process.

Next, an outline of the dual-axis pulse motor will be explained below with reference to FIGS. 15 to 17.

FIG. 15 is a view showing the entire dual-axis pulse motor. A movable portion 2020 floats by about 20 μm on a platen 2010 having platen convex portions 2012, and can move in the X and Y directions. More specifically, as shown in FIG. 16, the movable portion 2020 has air discharge holes 2060 for floating it by discharging air against the platen 2010, and is formed by arranging two uniaxial movable portions 1020 shown in FIGS. 13A to 13D in each of the X and Y directions. As shown in FIG. 17, the platen 2010 has the periodical platen convex portions 2012 (in the form of a matrix) and a platen concave portion 2014 on the surface. The platen concave portion 2014 is filled with the non-magnetic epoxy resin ER.

The surface (opposite to the movable portion) of the platen 2010 is an air-bearing running surface of the movable portion 2020, and hence required to have high surface accuracy. In the manufacturing process of the platen 2010, therefore, after the epoxy resin ER is filled in the platen concave portion 2014 and cured, the surface of the platen 2010 is ground by wet surface grinding and subjected to a rust preventing process (plating or coating), in the same manner as for the platen 1010.

Generally, the thrust of a motor apparatus such as the linear pulse motor or dual-axis pulse motor as described above is proportional to the square of the magnetic flux density in the gap (magnetic gap) between the movable portion and platen (stator). Note that the magnetic gap is specifically a gap from the platen convex portions to the movable-portion teeth.

The magnetic gap is equal to the floating amount of the air bearing when no rust preventing process is performed on the platen, and equal to the sum of the thickness of a plating layer or coating layer and the floating amount of the air bearing when the rust preventing process is performed on the platen. As the magnetic gap decreases, the magnetic flux density increases, so the thrust of the motor apparatus increases.

Although the sensitivity of the thrust of the motor apparatus to the magnetic gap depends on the configuration of a magnetic circuit, this sensitivity is generally about 0.5 to 2%/μm. The floating amount of the air bearing is about 5 to 10 μm, and the critical value of the thickness of the plating layer is about 50 μm. If the floating amount of the air bearing is 5 μm or less, the movable portion and platen (stator) come in contact with each other because, for example, the movable portion deforms. Also, if the thickness of the plating layer is 50 μm or less, the plating layer peels off because the adhesion is insufficient. When the rust preventing process is performed, therefore, even a minimum magnetic gap must be 55 to 60 μm.

These techniques are proposed in Japanese Patent Laid-Open No. 2006-141080.

Unfortunately, the above-mentioned motor apparatuses have the following four problems.

The first problem is the decrease in thrust of the motor apparatus caused by the rust preventing process. When a plating layer is formed on the platen convex portions as the rust preventing process, the thrust of the motor apparatus decreases in proportion to the thickness of the plating layer as described previously. This decrease in thrust of the motor apparatus can be suppressed by minimizing the thickness of the plating layer. However, if the thickness of the plating layer is smaller than 50 μm, the plating layer peels off because the adhesion is insufficient. Accordingly, it is very difficult to decrease the magnetic gap to 55 μm or less.

The second problem is the fluctuation in thrust of the motor apparatus caused by the difference between the platen convex portion and the surface of the epoxy resin filled in the platen concave portion. In the conventional motor apparatus as described above, the air-bearing running surface is formed by filling the platen concave portion with the epoxy resin, and ground by wet surface grinding. In this wet surface grinding, a grinding solution swells the epoxy resin. Since this produces a difference of 5 to 10 μm between the platen convex portion and the surface of the epoxy resin, the floating amount of the air bearing changes within the range of the pitch of the movable-portion teeth. As a consequence, the magnetic gap between the movable portion and platen (stator) changes, and the thrust of the motor apparatus fluctuates.

The third problem is the decrease in thrust of the motor apparatus caused by deterioration of the surface accuracy of the air-bearing running surface. As described above, the platen concave portion is filled with the epoxy resin. Volume shrinkage when this epoxy resin cures deforms the whole platen, and this deteriorates the surface accuracy of the air-bearing running surface. In particular, the peripheral portions of the platen readily deform (warp). As the movable portion moves to the peripheral portion of the platen, therefore, the magnetic gap widens, and this decreases the thrust of the motor apparatus.

The fourth problem is the complexity of the manufacturing process caused by the rust preventing process. When forming a plating layer of the surface of the platen, no plating layer adheres to the epoxy resin (surface) filled in the platen concave portion. This produces a difference equal to the thickness of the plating layer between the platen convex portion and the surface of the epoxy resin. To eliminate this difference, it is necessary to coat the platen surface with the epoxy resin again, and perform finishing surface grinding. Thus, the rust preventing (plating layer formation) step, epoxy resin filling step, and surface grinding step must be repeated several times to manufacture the platen. This complicates the manufacturing process and increases the manufacturing cost.

SUMMARY OF THE INVENTION

The present invention provides a motor apparatus capable of suppressing the decrease and fluctuation in thrust, simplifying the manufacturing process, and reducing the manufacturing cost.

According to one aspect of the present invention, there is provided a motor apparatus which includes a movable portion including a coil and a tooth-like salient pole, and a platen opposed to the movable portion, and moves the movable portion and the platen relative to each other by using a magnetic field generated by supplying a current to the coil, wherein the platen includes a base material having a surface on which convex portions and first concave portions are periodically arranged, a first thermally sprayed layer formed on the surface of the base material by thermal spraying such that second concave portions are formed inside the first concave portions, and a resin filled in the second concave portions.

Further features of the present invention will become apparent from the following description of exemplary embodiments with reference to the attached drawings.

BRIEF DESCRIPTION OF THE DRAWINGS

FIG. 4 is an enlarged sectional view showing the portion between the platen and movable portion, specifically, the portion around the gap from the platen convex portions to the movable-portion teeth, in the motor apparatus shown in FIG. 1.

FIG. 5 is an enlarged sectional view showing the portion between the platen and movable portion, specifically, the portion around the gap from the platen convex portions to the movable-portion teeth, in the motor apparatus shown in FIG. 1.

DESCRIPTION OF THE EMBODIMENTS

Figure 1:
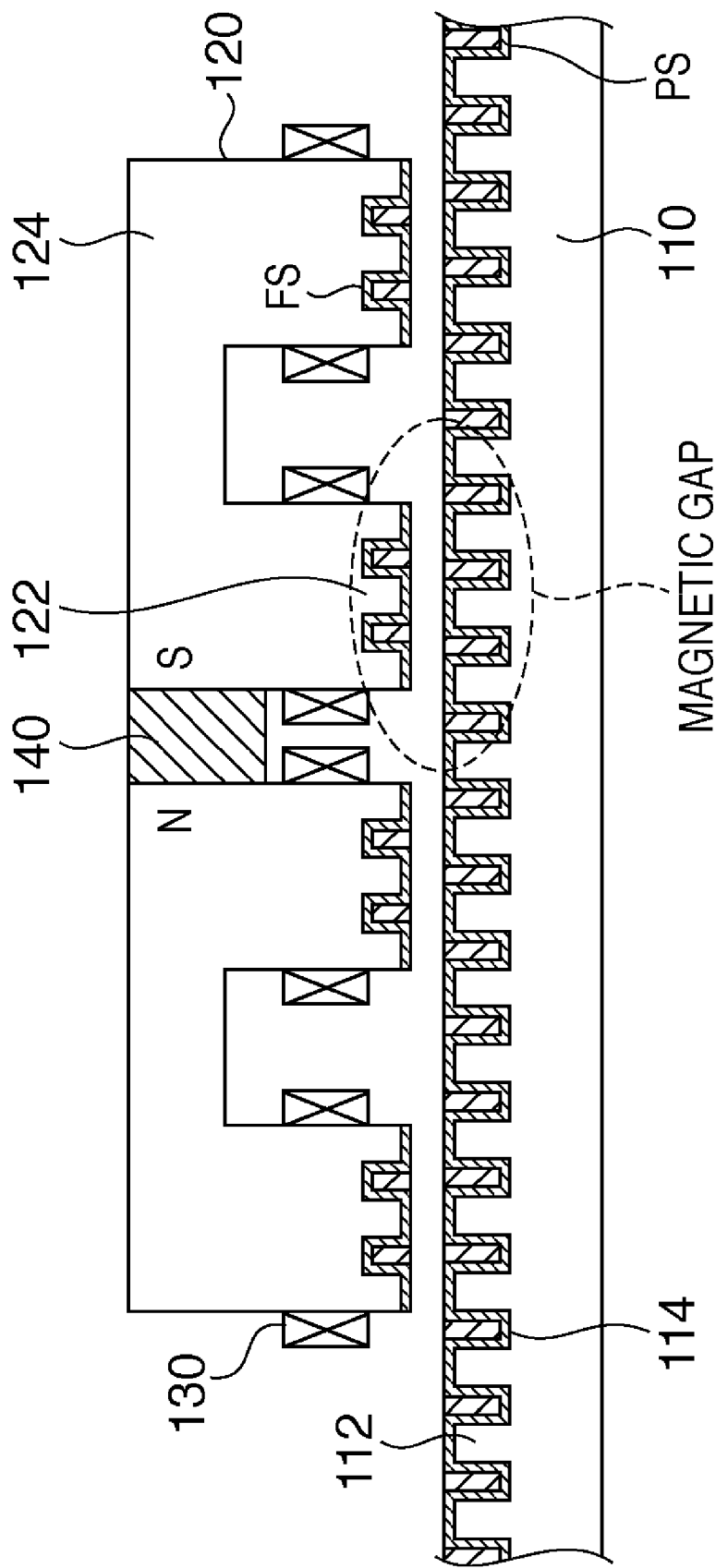
FIG. 1 is a schematic sectional view showing the arrangement of a motor apparatus as an aspect of the present invention.

Embodiments of the present invention will be explained below with reference to the accompanying drawings. Note that the same reference numerals denote the same parts in these drawings, and a repetitive explanation will be omitted.

FIG. 1 is a schematic sectional view showing the arrangement of a motor apparatus 1 as an aspect of the present invention. In this embodiment as shown in FIG. 1, the motor apparatus 1 is implemented as a linear pulse motor. However, the motor apparatus 1 is not limited to the linear pulse motor, and also applicable to, for example, a dual-axis pulse motor.

A platen (stator) 110 of the linear pulse motor is mainly formed by a base material having a surface PS on which convex portions (platen convex portions) 112 and concave portions (platen concave portions) 114 are periodically arranged (i.e., formed at predetermined intervals). A movable portion 120 has a tooth-like salient pole 124 for generating a traveling magnetic field. The tooth-like salient pole 124 is mainly formed by a base member having a surface FS on which teeth (movable-portion teeth) 122 are periodically arranged (i.e., formed at predetermined intervals). Note that the platen 110 is opposed to the movable portion 120. Coils 130 magnetize the movable-portion teeth 122 by currents. A permanent magnet 140 generates attraction between the platen 110 and movable-portion teeth 122.

As explained earlier with reference to FIGS. 13A to 13D, the movable portion 120 can move above the platen 110, while a predetermined clearance is maintained, in accordance with the operation principle of the linear pulse motor, by switching the directions of the currents to be supplied to the coils 130. The clearance can be maintained by discharging a gas from an air bearing (not shown) formed in the movable portion 120, thereby floating the movable portion 120 from the platen 110. Thus, the motor apparatus 1 moves the movable portion 120 and platen 110 relative to each other by using magnetic fields generated by supplying currents to the coils 130.

Figure 2:
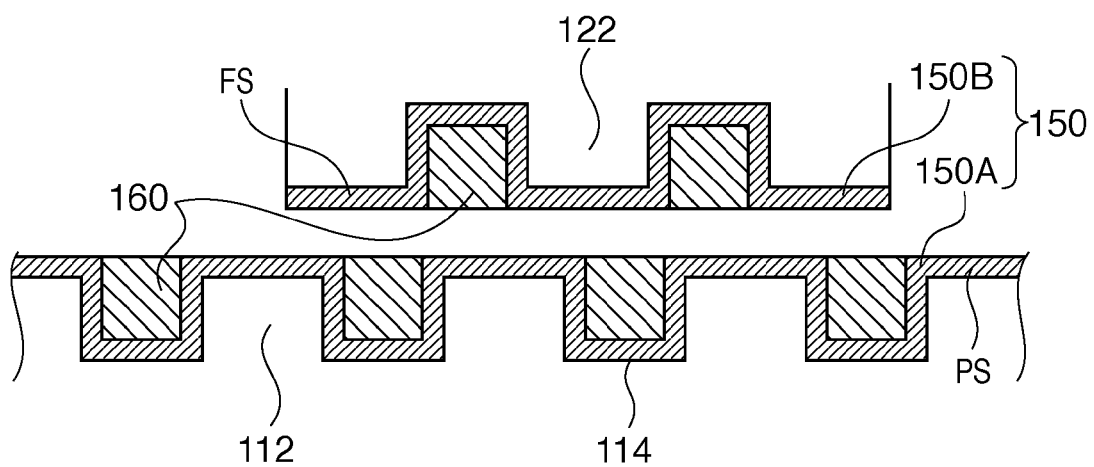
FIG. 2 is an enlarged sectional view showing a portion between a platen and movable portion, specifically, a portion around a gap from platen convex portions to movable-portion teeth, in the motor apparatus shown in FIG. 1.

FIG. 2 is an enlarged sectional view showing a portion between the platen 110 and movable portion 120, specifically, a portion (a region enclosed with the dotted line in FIG. 1) around the gap (magnetic gap) from the platen convex portions 112 to the movable-portion teeth 122.

Referring to FIG. 2, on the surface PS of the platen 110, a thermally sprayed layer (first thermally sprayed layer) 150A as a protective layer is formed by thermal spraying, as a rust preventing process, so as to form a second concave portion inside the platen concave portion 114 as a first concave portion. Similarly, on the surface FS of the movable portion 120, a thermally sprayed layer (third thermally sprayed layer) 150B is formed by thermal spraying, as a rust preventing process, so as to form a third concave portion inside the portion between the movable-portion teeth 122. Note that the thermally sprayed layer 150 need only be formed on at least the surface PS of the platen 110, and need not be formed on the surface FS of the movable portion 120. Since the surface PS of the platen 110 and the surface FS of the movable portion 120 are magnetic paths of the linear pulse motor, a traveling magnetic field generates an eddy current loss. Accordingly, the material of the thermally sprayed layer 150 is ceramics superior in non-magnetism, electrical insulation properties, and cutting properties and adhesion after thermal spraying. Also, a resin 160 such as an epoxy resin is filled in the platen concave portions 114 (second concave portions) on the surface PS of the platen 110 and in the portions (third concave portions) between the movable-portion teeth 122 on the surface FS of the movable portion 120, in which the thermally sprayed layers 150 are formed.

Thermal spraying herein mentioned is generally a technique that forms a thermally sprayed layer (film) by heating a coating material such as ceramics, metal, or cermet, and colliding fine molten or semi-molten particles against a base material (surface) at a high speed. In this thermal spraying, a junction between the base material and thermally sprayed layer is a physical junction. Therefore, a thermally sprayed layer can be formed by using a material that melts or softens. In other words, thermal spraying can be performed by using any material. Likewise, the dimensions and shape of the base material are not limited, so a thermally sprayed layer can be formed on any base material. Accordingly, it is possible to improve the wear resistance, corrosion resistance, electrical insulation properties, lubricating properties, friction properties, and the like of the base material (surface) by selecting the material of a thermally sprayed layer in accordance with the application.

Note that the surface of the base material must be roughened by sandblast before thermal spraying. More specifically, to adhere fine molten or semi-molten particles (a thermally sprayed layer) to the base material, the surface roughness of the base material must be increased to 5 μm or more. The fine molten or semi-molten particles are collided against the base material having appropriate surface roughness, and stacked on the surface by a physical junction as they are rapidly cooled. In this state, pores or void channels form between the stacked particles. Since the pores or void channels extend from the surface of the thermally sprayed layer to the surface of the base material, they deteriorate the wear resistance, corrosion resistance, electrical insulation properties, lubricating properties, friction properties, and the like. Therefore, a sealing process of sealing the pores or void channels is performed after the thermally sprayed layer is formed.

In this embodiment, the maximum surface roughness of the surface PS of the platen 110 and the surface FS of the movable portion 120 was set at 5 µm, and a 15-µm thick thermally sprayed layer 150 made of alumina ceramics was formed by thermal spraying.

Even when the thickness of the thermally sprayed layer 150 as the rust preventing process is thus decreased to 15 µm, it is possible to ensure the adhesion and rust resistance between the surface PS of the platen 110 or the surface FS of the movable portion 120 and the thermally sprayed layer 150. This makes it possible to decrease the magnetic gap between the platen 110 and movable portion 120 (from the platen convex portions 112 to the movable-portion teeth 122) to 20 µm, thereby suppressing the decrease in thrust of the motor apparatus 1. Note that if the thickness of the thermally sprayed layer 150 is decreased too much, the surface PS of the platen 110 and the surface FS of the movable portion 120 may be exposed, and this may make it impossible to assure a high rust resistance. To secure a high rust resistance, therefore, the thickness of the thermally sprayed layer 150 is larger than 15 µm.

Also, since the thermally sprayed layer 150 is formed, the surface PS of the platen 110 (i.e., the platen convex portions 112 on which the thermally sprayed layer 150 is formed and the platen concave portions 114 filled with the resin 160) can be ground by dry surface grinding without using any grinding solution. Accordingly, it is possible to prevent swelling of the resin 160 filled in the platen concave portions 114, and decrease the difference between the platen convex portion 112 and the surface of the resin 160 filled in the platen concave portion 114. More specifically, the difference between the platen convex portion 112 and the surface of the resin 160 filled in the platen concave portion 114 can be decreased to 1 µm or less. This makes it possible to reduce the fluctuation in thrust of the motor apparatus 1 in the range of the pitch of the movable-portion teeth 122.

In addition, it is unnecessary to repeat the resin filling step of filling the resin 160 in the platen concave portions 114 and the surface grinding step. Since this simplifies the manufacturing process of the motor apparatus 1, the manufacturing cost can be reduced.

Note that as shown in FIGS. 3 to 6, non-magnetic solid members are charged in the resin 160 filled in the platen concave portions 114 of the surface PS of the platen 110 on which the thermally sprayed layer 150 is formed, and in the resin 160 filled between the movable-portion teeth 122 of the surface FS of the movable portion 120.

Figure 3:
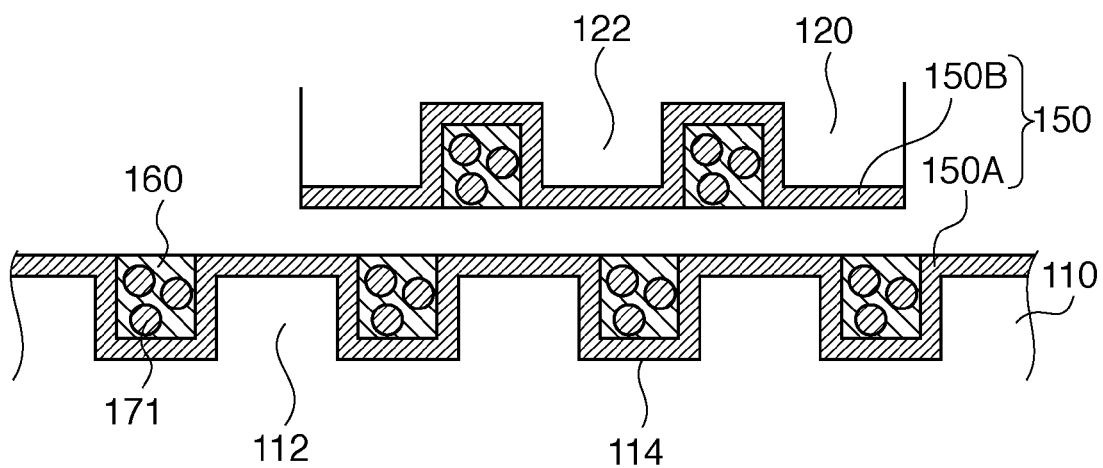
FIG. 3 is an enlarged sectional view showing the portion between the platen and movable portion, specifically, the portion around the gap from the platen convex portions to the movable-portion teeth, in the motor apparatus shown in FIG. 1.
Figure 6:
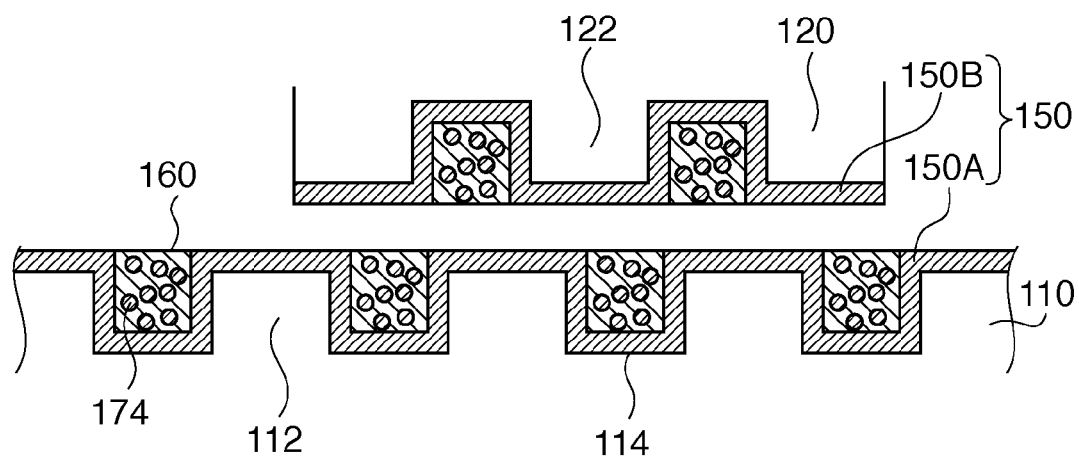
FIG. 6 is an enlarged sectional view showing the portion between the platen and movable portion, specifically, the portion around the gap from the platen convex portions to the movable-portion teeth, in the motor apparatus shown in FIG. 1.

More specifically, referring to FIG. 3, non-magnetic balls 171 such as glass balls, ceramics balls, or resin balls are charged in the resin 160 filled in the platen concave portions 114 and between the movable-portion teeth 122. Referring to FIG. 4, a non-magnetic resin 172 having the shape of a rectangular parallelepiped, square bar, or cylindrical bar is charged in the resin 160 filled in the platen concave portions 114 and between the movable-portion teeth 122. Referring to FIG. 5, non-magnetic plates 173 made of, for example, a ceramic sheet or fibers are charged in the resin 160 filled in the platen concave portions 114 and between the movable-portion teeth 122. Referring to FIG. 6, a non-magnetic powder 174 such as carbon black or calcium carbonate is charged in the resin 160 filled in the platen concave portions 114 and between the movable-portion teeth 122.

By thus charging the non-magnetic solid members in the resin 160, it is possible to reduce the volume of the resin 160 filled in the platen concave portions 114 of the surface PS of the platen 110 and between the movable-portion teeth 122 of the surface FS of the movable portion 120. Since this relaxes volume shrinkage when the resin 160 cures, deformation of the platen 110 and movable portion 120 reduces. This makes it possible to suppress the decrease in thrust of the motor apparatus 1.

Figure 7:
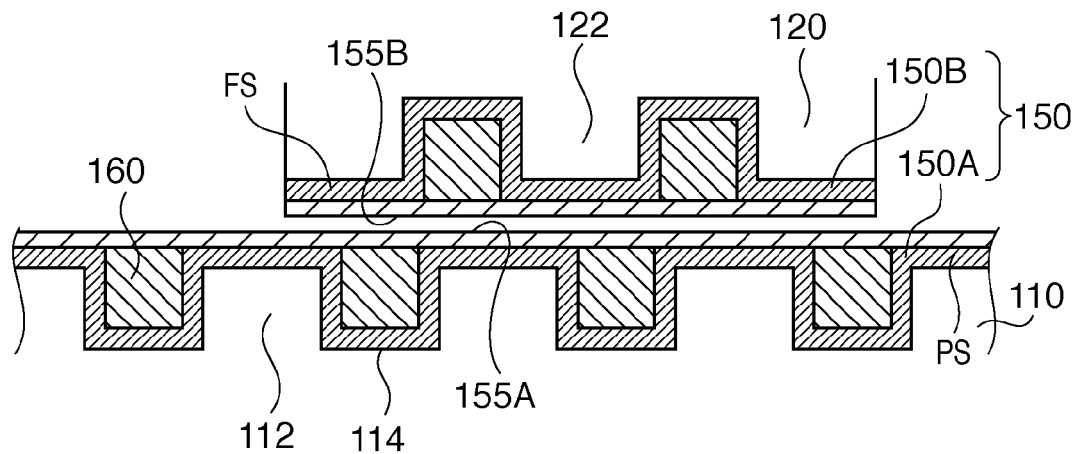
FIG. 7 is an enlarged sectional view showing the portion between the platen and movable portion, specifically, the portion around the gap from the platen convex portions to the movable-portion teeth, in the motor apparatus shown in FIG. 1.

As shown in FIG. 7, it is also possible to form a thermally sprayed layer (second thermally sprayed layer) 155A having a flat plane formed by thermal spraying, so as to cover the thermally sprayed layer 150A formed on the platen convex portions 112 and the resin 160 filled in the platen concave portions 114. Similarly, a thermally sprayed layer 155B having a flat plane formed by thermal spraying may also be formed to cover the thermally sprayed layer 150B formed on the movable-portion teeth 122 and the resin 160 filled between the movable-portion teeth 122. This makes it possible to maintain high surface accuracy of the platen 110 and movable portion 120, and suppress the decrease in thrust of the motor apparatus 1.

Figure 8:
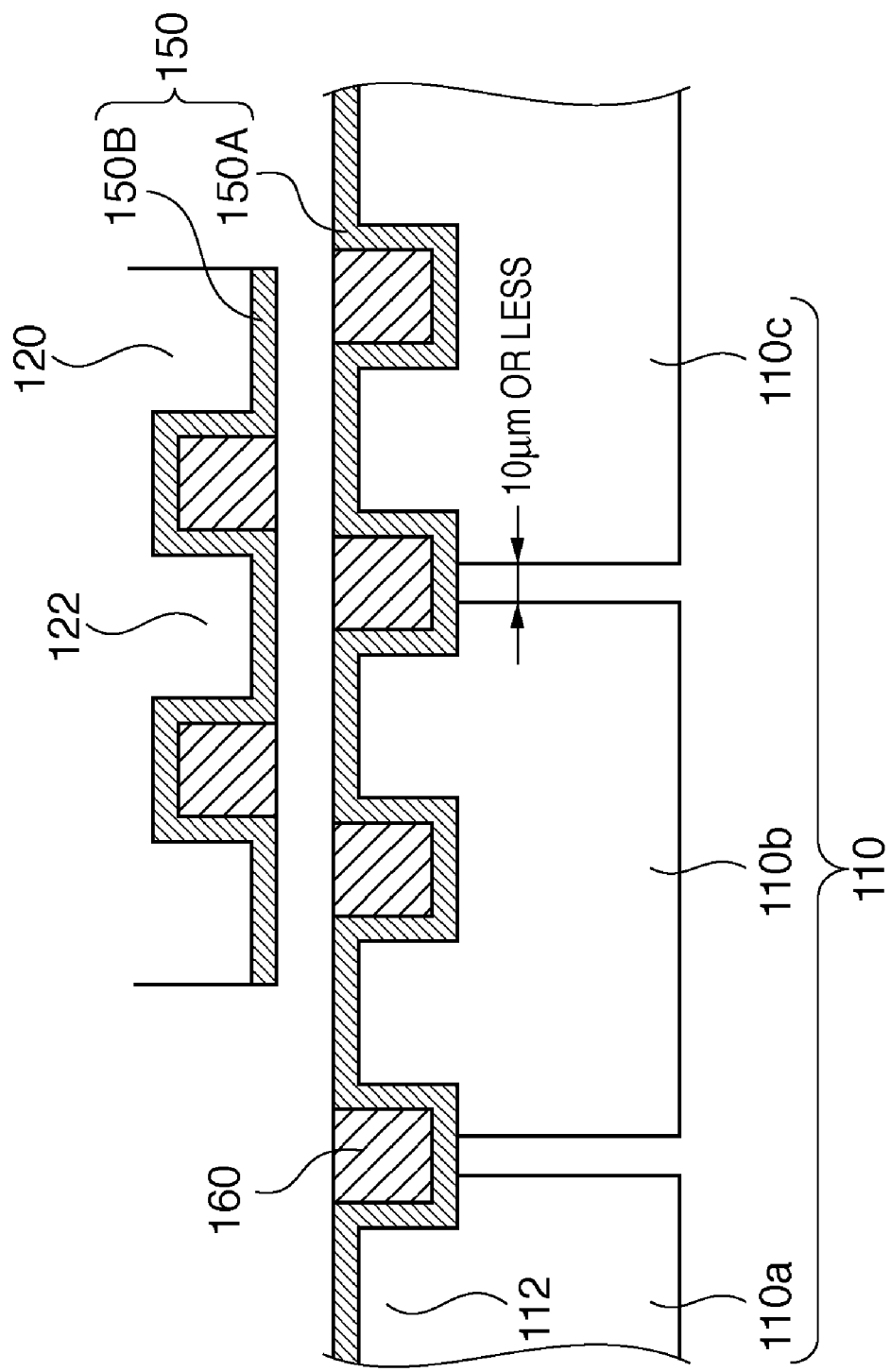
FIG. 8 is an enlarged sectional view showing the portion between the platen and movable portion, specifically, the portion around the gap from the platen convex portions to the movable-portion teeth, in the motor apparatus shown in FIG. 1.

As shown in FIG. 8, the platen 110 may also be formed by a plurality of partial platens 110a to 110c. In this structure, the plurality of partial platens 110a to 110c can be connected by forming the thermally sprayed layer 150A between the partial platens 110a and 110b and between the partial platens 110b and 110c by thermal spraying. Accordingly, the surfaces of the plurality of partial platens 110a to 110c can be simultaneously leveled with each other by surface grinding, so the area of the platen 110 can be increased. Note that to connect the plurality of partial platens 110a to 110c by the thermally sprayed layer 150, the spacings between the plurality of partial platens 110a to 110c must be decreased to 10 µm or less.

Figure 9:
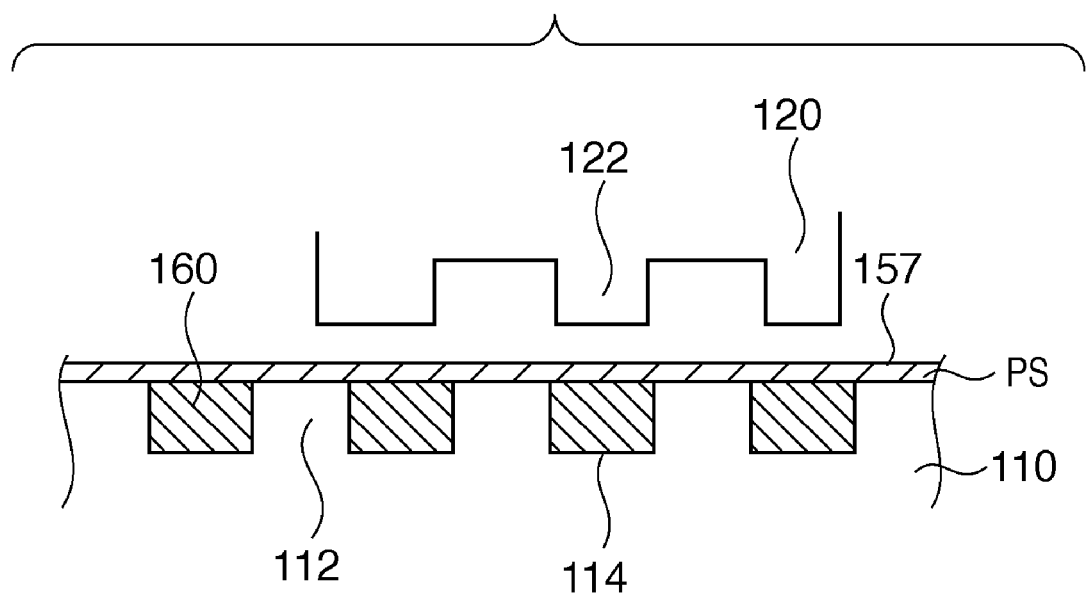
FIG. 9 is an enlarged sectional view showing the portion between the platen and movable portion, specifically, the portion around the gap from the platen convex portions to the movable-portion teeth, in the motor apparatus shown in FIG. 1.

As shown in FIG. 9, after the resin 160 is filled in the platen concave portions 114, a thermally sprayed layer 157 may also be formed by thermal spraying on the surface PS of the platen 110 (i.e., the platen convex portions 112 and the platen concave portions 114 filled with the resin 160). The thermally sprayed layer 157 has a flat plane formed by thermal spraying so as to cover the resin 160 filled in the platen concave portions 114 and the platen convex portions 112 exposed between the platen concave portions 114. In this structure, the thermally sprayed layer 157 is formed on the resin 160 in the platen concave portions 114, so the thermally sprayed layer 157 is formed on the entire surface PS of the platen 110. Generally, a thermally sprayed layer hardly adheres to a resin. However, when thermal spraying is performed at a low temperature on a resin filled with 50% or more of a filler, for example, fine molten or semi-molten particles adhere to the surface of the resin, and this makes a thermally sprayed layer formable.

Figure 10:
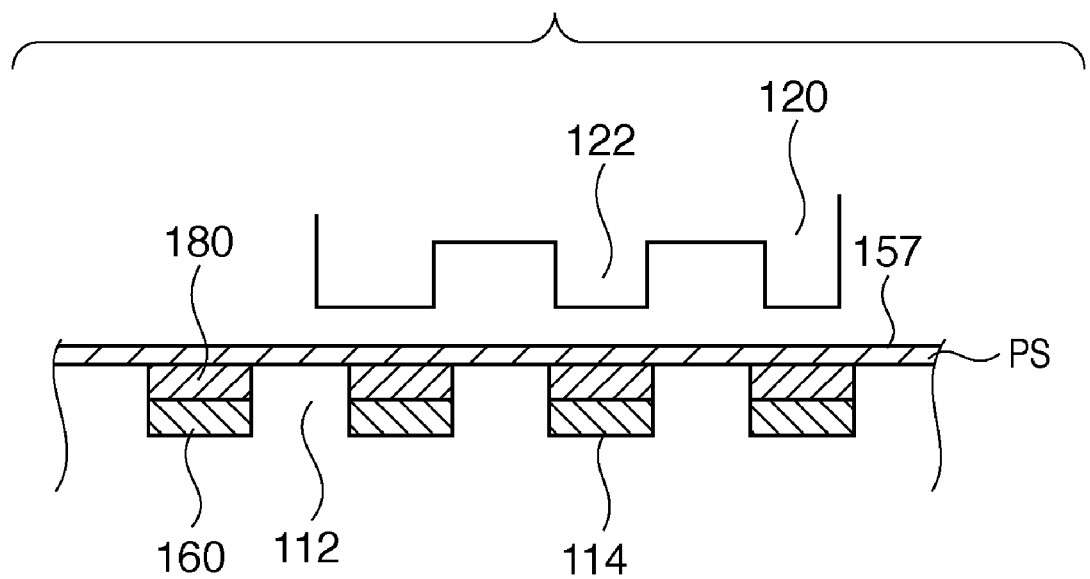
FIG. 10 is an enlarged sectional view showing the portion between the platen and movable portion, specifically, the portion around the gap from the platen convex portions to the movable-portion teeth, in the motor apparatus shown in FIG. 1.

As shown in FIG. 10, a thermally sprayed layer 157 may also be formed by thermal spraying after the resin 160 is filled in the platen concave portions 114, and a primer layer 180 for thermal spraying is stacked on the resin 160. In this structure, the primer layer 180 is formed on the resin 160 in the platen concave portions 114, and the thermally sprayed layer 157 is formed on the whole of the surface PS of the platen 110. Although a thermally sprayed layer hardly adheres to a resin as described above, the thermally sprayed layer 157 can be easily formed by forming the primer layer 180 on the resin 160.

Figure 11:
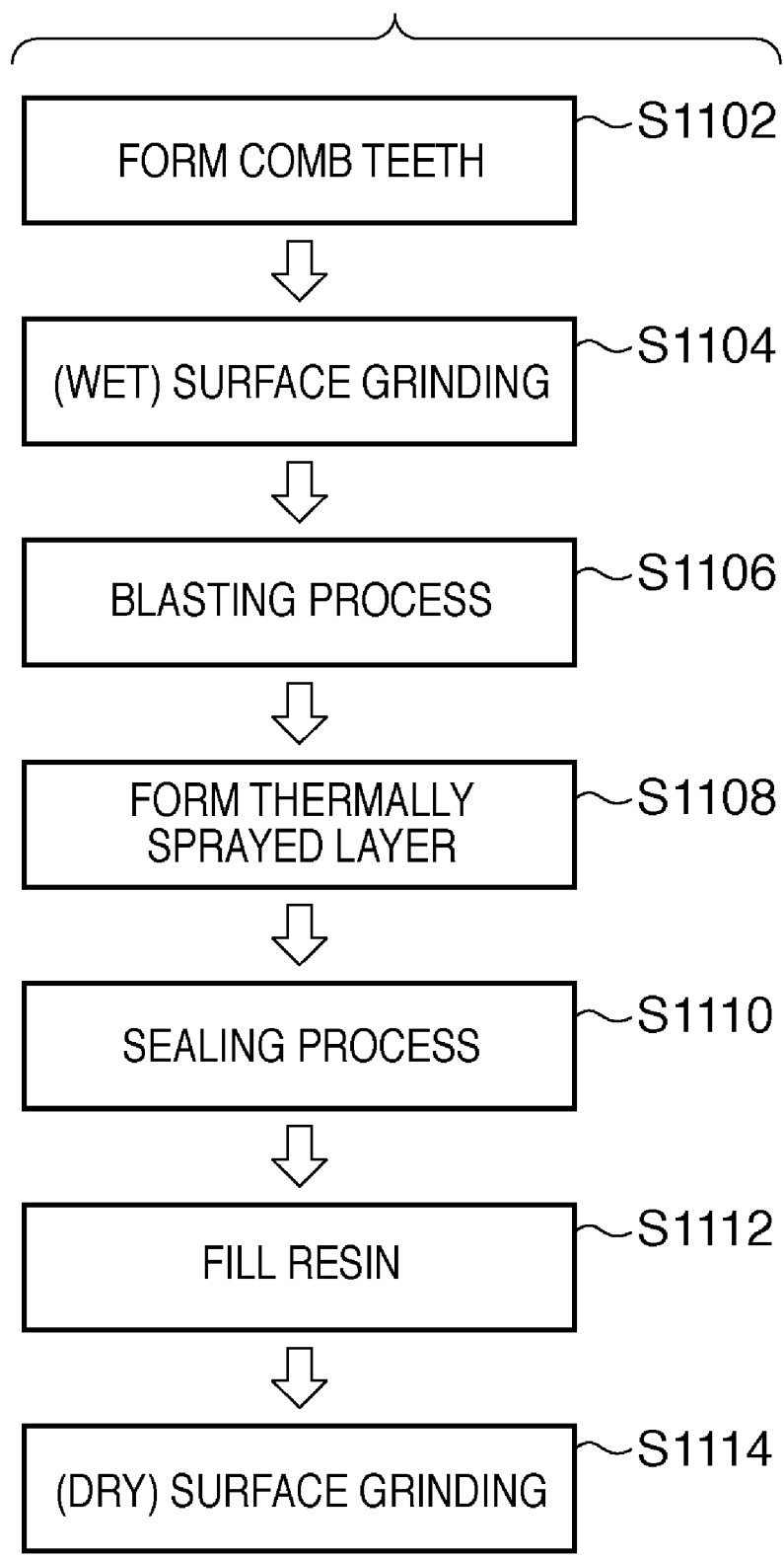
FIG. 11 is a flowchart for explaining a method of manufacturing the motor apparatus as the aspect of the present invention.

A method of manufacturing the motor apparatus 1 will be explained below with reference to FIG. 11. Note that the feature of the motor apparatus 1 is the manufacture of the platen 110, and the manufacture of the movable portion 120 and the assembly of the individual parts are the same as those of conventional methods. In this embodiment, therefore, the manufacture of the platen 110 will mainly be explained.

First, in step S1102, comb teeth are formed at predetermined intervals on the base material of a platen 110, thereby periodically forming platen convex portions 112 and platen concave portions 114 on the base material of the platen 110. Note that the base material of the platen 110 is preferably a laminated steel sheet in order to reduce the motor core loss.

Then, in step S1104, wet surface grinding is performed on the base material having the platen convex portions 112 and platen concave portions 114. More specifically, surface grinding is performed such that the surface accuracy of the platen convex portions 112 is 5 μm or less.

In step S1106, a blasting process is performed on the base material having the platen convex portions 112 and platen concave portions 114. More specifically, the blasting process is performed such that the maximum surface roughness of the base material having the platen convex portions 112 and platen concave portions 114 is 5 μm.

In step S1108, a thermally sprayed layer 150A is formed by thermal spraying on the base material having the platen convex portions 112 and platen concave portions 114. For example, a 50-μm thick thermally sprayed layer 150A is formed by using alumina ceramics as a material.

In step S1110, a sealing process is performed. A sealing agent is, for example, a room temperature curing epoxy resin. Note that a thermosetting resin may also be used as the sealing agent, but the sealing process must be performed with the base material of the platen 110 being held so as to prevent warpage of the base material.

In step S1112, a resin 160 is filled in the platen concave portions 114 in which the thermally sprayed layer 150A is formed. When filling the resin 160, the entire surface of the base material of the platen 110 is impregnated with the resin in a vacuum in order to prevent mixing of bubbles. When charging non-magnetic solid members, the non-magnetic solid members need only be charged in the platen concave portions 114 in which the thermally sprayed layer 150A is formed, before the resin 160 is filled.

In step S1114, dry surface grinding is performed on the base material of the platen 110 (i.e., on the platen convex portions 112 on which the thermally sprayed layer 150A is formed and the platen concave portions 114 filled with the resin 160). Although the thermally sprayed layer 150A and resin 160 are simultaneously ground in step S1114, the resin 160 is ground more easily than the thermally sprayed layer 150A because the Young's moduli of the thermally sprayed layer 150A and resin 160 are different. Accordingly, surface grinding is performed by selecting a whetstone and controlling the film thickness as well as appropriately adjusting the cutting amount and grinding rate.

As described above, the manufacturing method of the present invention can manufacture the motor apparatus 1 capable of simplifying the manufacturing process and reducing the manufacturing cost, and yet capable of suppressing the decrease and fluctuation in thrust.

Figure 12:
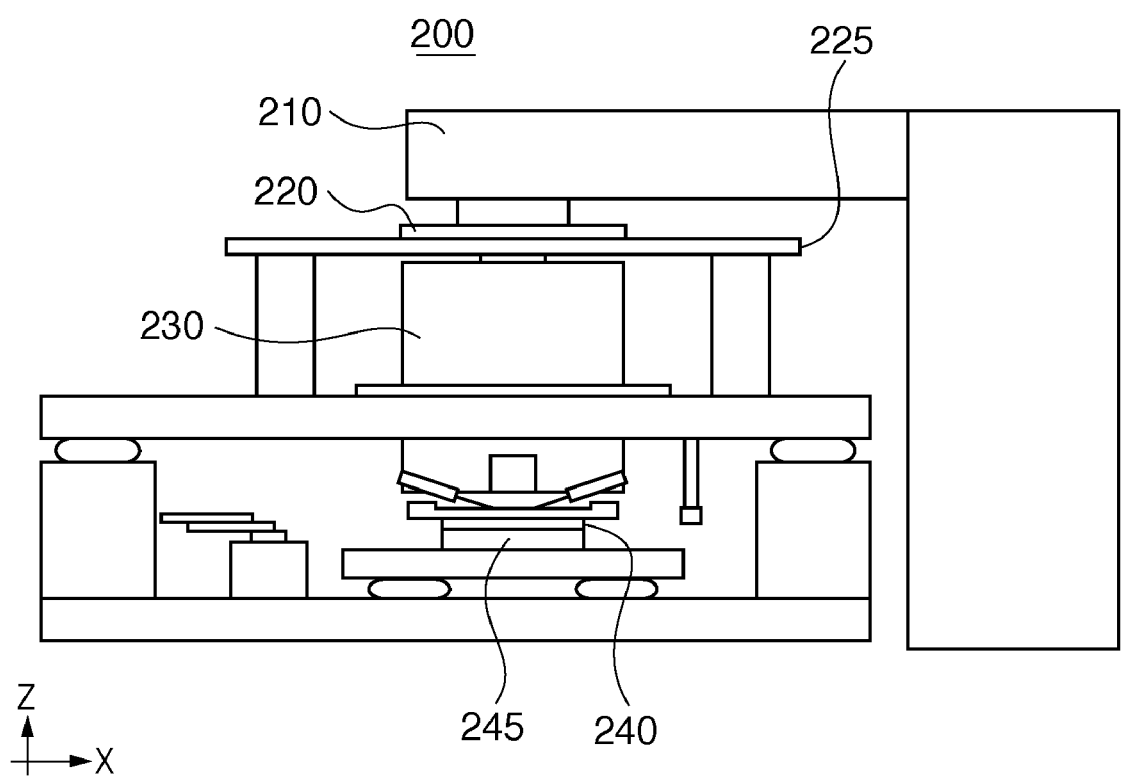
FIG. 12 is a schematic view showing the arrangement of an exposure apparatus as an aspect of the present invention.
Figure 13A:
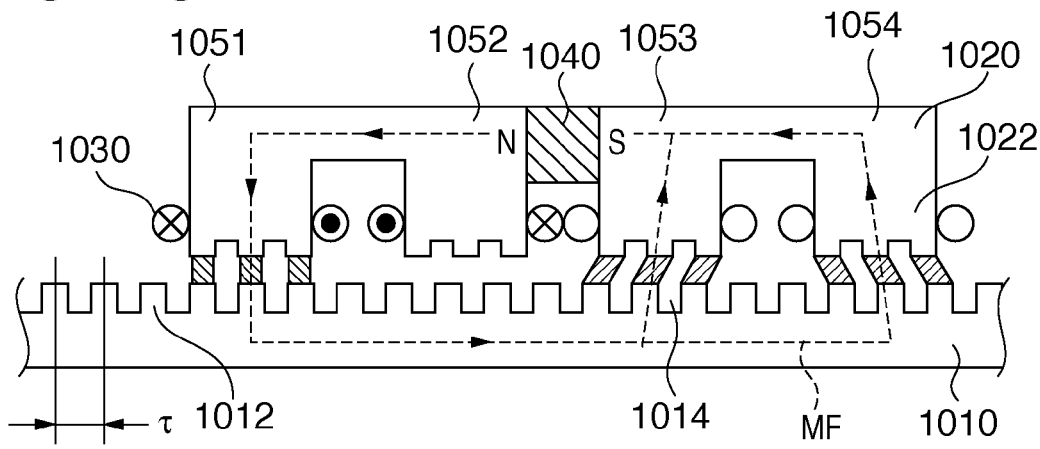
FIGS. 13A to 13D are views for explaining an outline of a linear pulse motor.
Figure 13B:
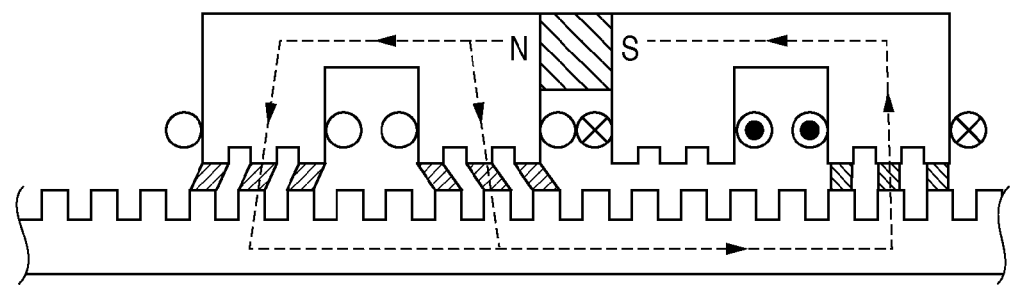
Figure 13C:
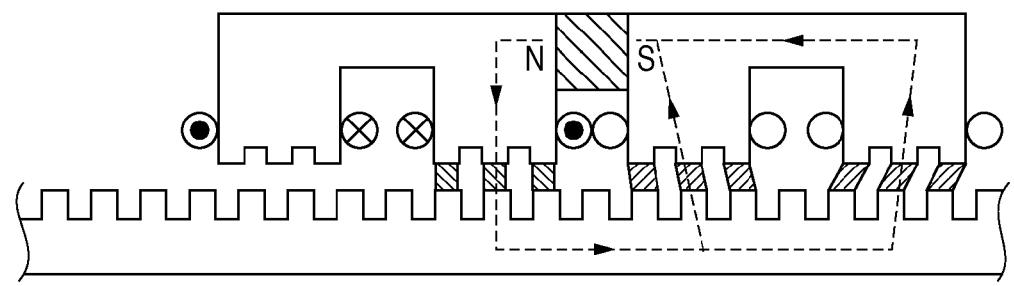
Figure 13D:
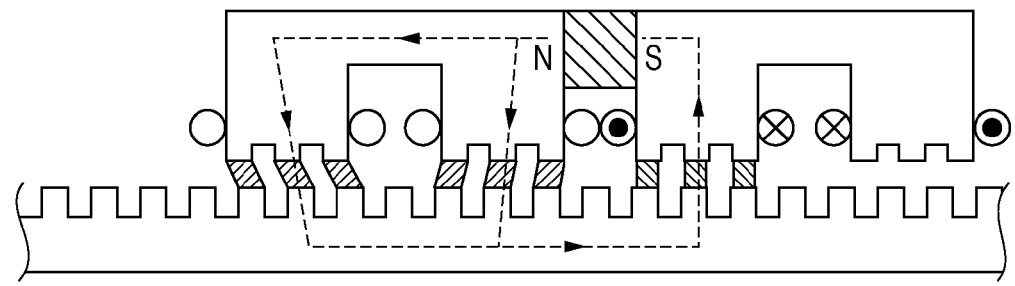
Figure 14:
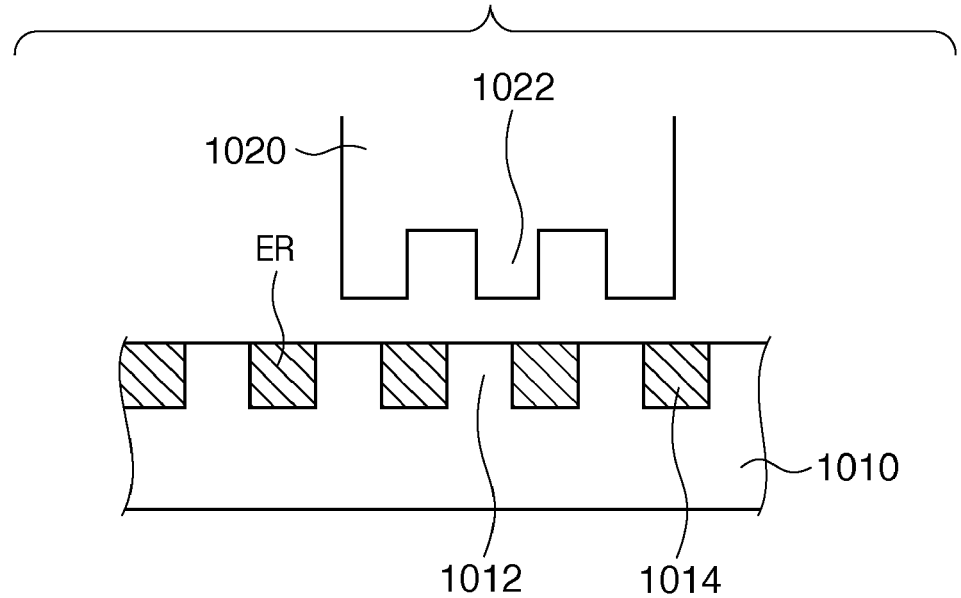
FIG. 14 is a view for explaining the outline of the linear pulse motor.
Figure 15:
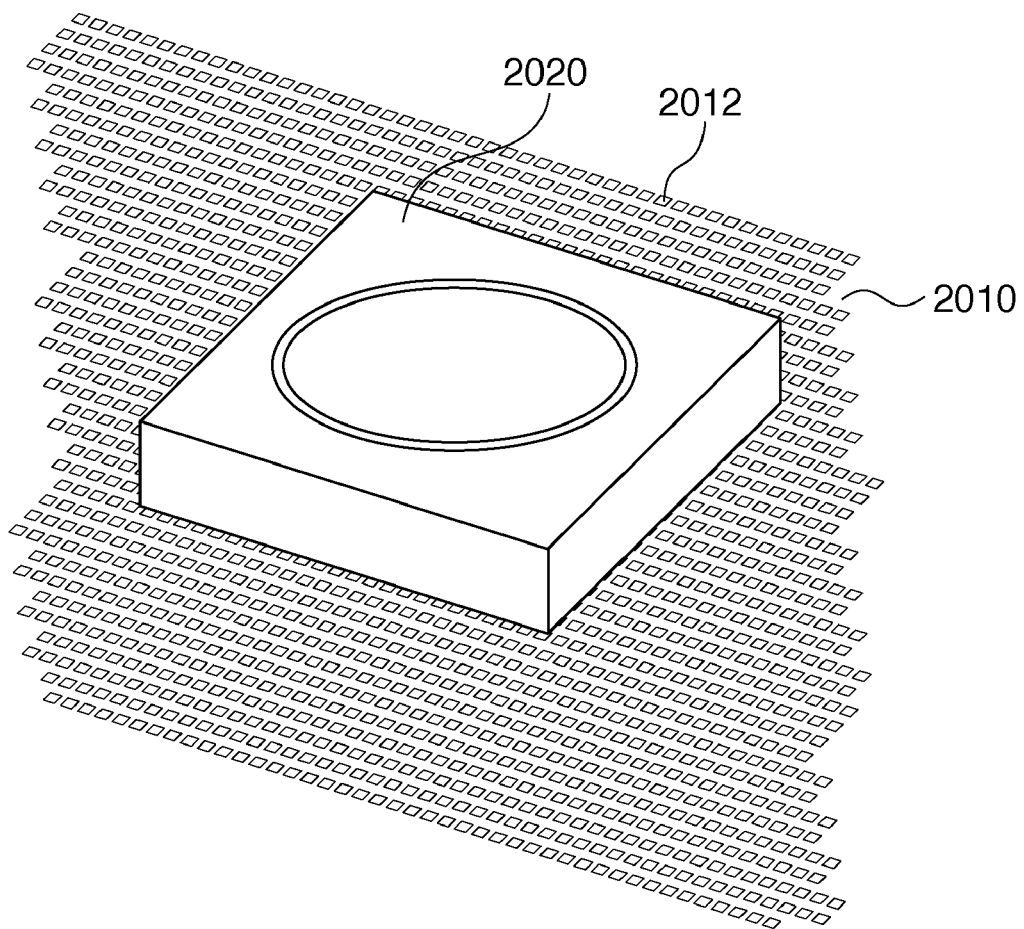
FIG. 15 is a view for explaining an outline of a dual-axis pulse motor.
Figure 16:
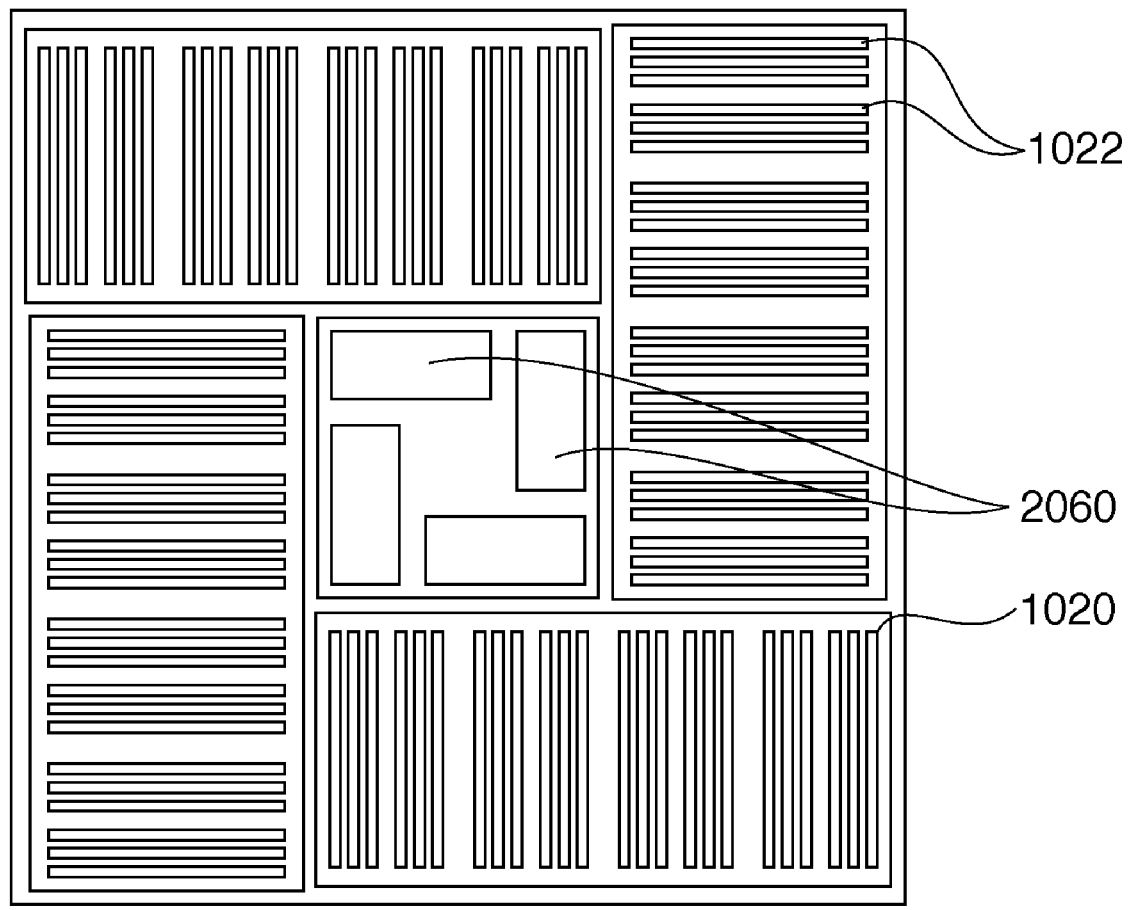
FIG. 16 is a view for explaining the outline of the dual-axis pulse motor.
Figure 17:
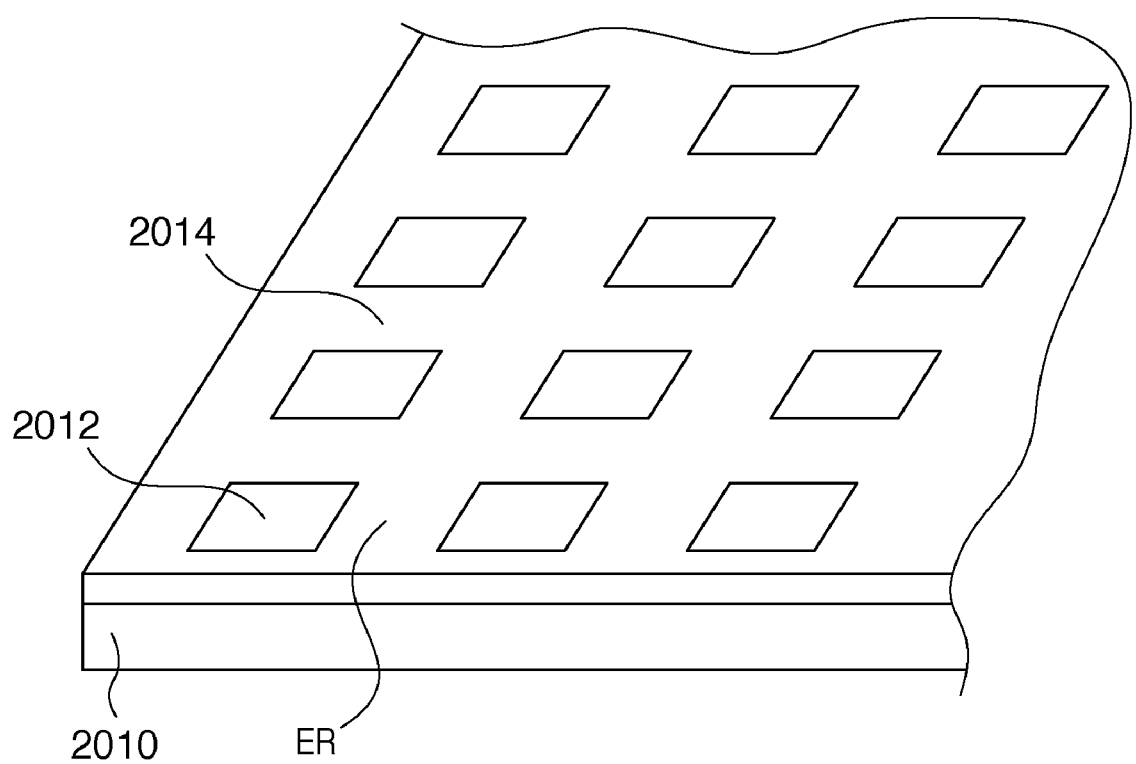
FIG. 17 is a view for explaining the outline of the dual-axis pulse motor.

An exposure apparatus 200 using the above-mentioned motor apparatus 1 will be explained below with reference to FIG. 12. FIG. 12 is a schematic view showing the arrangement of the exposure apparatus 200 as an aspect of the present invention.

In this embodiment, the exposure apparatus 200 is a projection exposure apparatus that exposes a wafer to reticle patterns by the step-and-scan method. However, the exposure apparatus 200 may also be applied to the step-and-repeat method or another exposure method.

As shown in FIG. 12, the exposure apparatus 200 includes an illumination apparatus 210, a reticle stage 225 for supporting a reticle 220, a projection optical system 230, and a wafer stage 245 for supporting a wafer 240.

The illumination apparatus 210 illuminates the reticle 220 having circuit patterns to be transferred, and includes a light source and illumination optical system. The light source is an excimer laser such as an ArF excimer laser having a wavelength of about 193 nm or a KrF excimer laser having a wavelength of about 248 nm. However, the light source is not limited to the excimer laser, and may also be an $F_2$ laser having a wavelength of about 157 nm or a narrow-band mercury lamp. The illumination optical system illuminates the reticle 220 by using light from the light source. The illumination optical system includes, for example, a lens, mirror, optical integrator, and stop.

The reticle 220 has circuit patterns and is supported and driven by the reticle stage 225. Diffracted light output from the reticle 220 is projected onto the wafer 240 via the projection optical system 230. Since the exposure apparatus 200 is a step-and-scan type exposure apparatus, the exposure apparatus 200 transfers the patterns of the reticle 220 onto the wafer 240 by scanning the reticle 220 and wafer 240.

The reticle stage 225 supports the reticle 220, and positions the reticle 220 by moving it in the X, Y, and Z directions and around the Z-axis.

The projection optical system 230 projects the patterns of the reticle 220 onto the wafer 240. As the projection optical system 230, it is possible to use a refracting system, catadioptric system, or reflecting system.

The wafer 240 is a substrate onto which the patterns of the reticle 220 are to be projected (transferred). However, a glass plate or another substrate may also be used instead of the wafer 240. The wafer 240 is coated with a resist.

The wafer stage 245 supports the wafer 240, and positions the wafer 240 by moving it in the X, Y, and Z directions and around the Z-axis. More specifically, the wafer stage 245 includes a fine motion stage mechanism for positioning the wafer 240, and a coarse motion stage mechanism for positioning the fine motion stage. The coarse motion stage mechanism includes the above-mentioned motor apparatus 1 as a driving unit. More specifically, a movable portion of the coarse motion stage mechanism includes the movable portion 120 of the motor apparatus 1, and a stator of the coarse motion stage mechanism includes the platen 110 of the motor apparatus 1. Note that the motor apparatus 1 is applied to only the driving unit of the wafer stage 245 in this embodiment, but the motor apparatus 1 may also be applied to a driving unit of the reticle stage 225.

In an exposing process, the illumination optical system illuminates the reticle 220 with the light emitted from the light source of the illuminating unit 210. Light reflecting the patterns of the reticle 220 forms an image on the wafer 240 via the projection optical system 230. The exposure apparatus 200 can economically provide a high-quality device (e.g., a semiconductor device, LCD device, image-sensing device (CCD or the like), or thin-film magnetic head) with throughput higher than those of conventional apparatuses. The device is fabricated through a step of exposing a substrate (e.g., a wafer or glass plate) coated with a photoresist (photosensitive agent) by using the exposure apparatus 200, a step of developing the exposed substrate, and other known steps.

Note that in this embodiment, the member having the coils and tooth-like salient poles is the movable portion, and the platen is the stator. However, it is also possible to use the member having the coils and tooth-like salient poles as the stator, and the platen as the movable portion. In this case, the air bearing is formed in the stator from the viewpoint of the flatness.

Also, when forming the air bearing in the movable portion (platen), a resin must be filled by thermal spraying between the tooth-like salient poles and between the teeth of the member having the coils and tooth-like salient poles. In this arrangement, the air bearing surface having high surface accuracy can be formed by thermal spraying and filling of the resin in the stator, and the influence of disturbance can be reduced in the movable portion because it has no power supply line.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-162406 filed on Jun. 20, 2008, which is hereby incorporated by reference herein in its entirety.

What is claimed is:

1. A motor apparatus which comprises a movable portion including a coil and a tooth-like salient pole, and a platen opposed to said movable portion, and moves said movable portion and said platen relative to each other by using a magnetic field generated by supplying a current to the coil, wherein said platen includes:
a base material having a surface on which convex portions and first concave portions are periodically arranged,
a first thermally sprayed layer formed on the surface of said base material by thermal spraying such that second concave portions are formed inside the first concave portions, and
a resin filled in the second concave portions.

2. The apparatus according to claim 1, wherein said platen further includes a second thermally sprayed layer having a flat surface formed by thermal spraying such that said resin filled in the second concave portions and said first thermally sprayed layer formed on the convex portions are covered.

3. The apparatus according to claim 1, wherein a non-magnetic solid member is charged in said resin filled in the second concave portions.

4. The apparatus according to claim 2, wherein said first thermally sprayed layer and said second thermally sprayed layer are made of ceramics.

5. The apparatus according to claim 1, wherein said movable portion includes:
a base member having a surface on which teeth are periodically arranged,
a third thermally sprayed layer formed by thermal spraying on the surface of said base member such that third concave portions are formed inside portions between the teeth, and
a resin filled in the third concave portions.

6. The apparatus according to claim 1, wherein
said platen includes a plurality of partial platens, and
said first thermally sprayed layer connects said plurality of partial platens.

7. The apparatus according to claim 1, wherein
said movable portion includes an air bearing, and
said movable portion is floated from said platen by discharging a gas from said air bearing.

8. A motor apparatus which comprises a movable portion including a coil and a tooth-like salient pole, and a platen opposed to said movable portion, and moves said movable portion and said platen relative to each other by using a magnetic field generated by supplying a current to the coil, wherein said platen includes:
a base material having a surface on which convex portions and concave portions are periodically arranged,
a resin filled in the concave portions, and
a thermally sprayed layer having a flat surface formed by thermal spraying such that said resin filled in the concave portions and the convex portions exposed between the concave portions are covered.

9. The apparatus according to claim 8, wherein
said movable portion includes an air bearing, and
said movable portion is floated from said platen by discharging a gas from said air bearing.

10. A motor apparatus comprising:
a first member including a coil and a tooth-like salient pole; and
a second member opposed to said first member and including a magnetic material,
wherein said second member includes
a base material having a surface on which convex portions and concave portions are periodically arranged,
a protective layer formed on surfaces of the convex portions and the concave portions, and
a filler filled in the concave portions in which said protective layer is formed.

11. The apparatus according to claim 10, wherein said protective layer is formed by thermally thermal spraying a material including ceramics.

12. The apparatus according to claim 10, wherein
said first member includes an air bearing, and
said first member is floated from said second member by discharging a gas from said air bearing.

13. A manufacturing method of manufacturing a motor apparatus which includes a movable portion including a coil and a tooth-like salient pole, and a platen opposed to the movable portion, and moves the movable portion and the platen relative to each other by using a magnetic field generated by supplying a current to the coil, the method comprising steps of:
periodically forming convex portions and first concave portions on a surface of a base material of the platen;
forming a thermally sprayed layer on the surface of the base material by thermal spraying such that second concave portions are formed inside the first concave portions; and
filling the second concave portions with a resin.

14. A manufacturing method of manufacturing a second member of a motor apparatus which includes a first member including a coil and a tooth-like salient pole, and the second member opposed to the first member and including a magnetic material, and which moves the first member and the second member relative to each other by using a magnetic field generated by supplying a current to the coil, the method comprising steps of:
periodically forming convex portions and concave portions on a surface of a base material of the second member;
forming a protective layer on surfaces of the convex portions and the concave portions of the base material;
filling a filler in the concave portions in which the protective layer is formed; and
grinding the protective layer and the filler.

15. An exposure apparatus comprising:
a projection optical system which projects a pattern of a reticle onto a substrate; and
a stage which positions the substrate,
wherein said stage includes a motor apparatus according to claim 1 as a driving unit.

16. An exposure apparatus comprising:
a projection optical system which projects a pattern of a reticle onto a substrate; and
a stage which positions the substrate,
wherein said stage includes a motor apparatus according to claim 8 as a driving unit.

17. An exposure apparatus comprising:
a projection optical system which projects a pattern of a reticle onto a substrate; and
a stage which includes a motor apparatus, and positions the substrate,
wherein said motor apparatus includes
a first member including a coil and a tooth-like salient pole, and
a second member opposed to said first member and including a magnetic material, and
said second member includes
a base material having a surface on which convex portions and concave portions are periodically arranged,
a protective layer formed on surfaces of the convex portions and the concave portions, and
a filler filled in the concave portions in which the protective layer is formed.

18. A device fabrication method comprising steps of:
exposing a substrate using an exposure apparatus; and
performing a development process for the substrate exposed,
wherein the exposure apparatus includes:
a projection optical system which projects a pattern of a reticle onto the substrate; and
a stage which includes a motor apparatus and positions the substrate,
wherein the motor apparatus which includes a movable portion including a coil and a tooth-like salient pole, and a platen opposed to the movable portion, and moves the movable portion and the platen relative to each other by using a magnetic field generated by supplying a current to the coil,
wherein the platen includes:
a base material having a surface on which convex portions and first concave portions are periodically arranged,
a first thermally sprayed layer formed on the surface of the base material by thermal spraying such that second concave portions are formed inside the first concave portions, and
a resin filled in the second concave portions.

19. A device fabrication method comprising steps of:
exposing a substrate using an exposure apparatus; and
performing a development process for the substrate exposed,
wherein the exposure apparatus includes:
a projection optical system which projects a pattern of a reticle onto the substrate; and
a stage which includes a motor apparatus and positions the substrate,
wherein the motor apparatus which includes a movable portion including a coil and a tooth-like salient pole, and a platen opposed to the movable portion, and moves said movable portion and the platen relative to each other by using a magnetic field generated by supplying a current to the coil,
wherein the platen includes:
a base material having a surface on which convex portions and concave portions are periodically arranged,
a resin filled in the concave portions, and
a thermally sprayed layer having a flat surface formed by thermal spraying such that said resin filled in the concave portions and the convex portions exposed between the concave portions are covered.

20. A device fabrication method comprising steps of:
exposing a substrate using an exposure apparatus; and
performing a development process for the substrate exposed,
wherein the exposure apparatus includes:
a projection optical system which projects a pattern of a reticle onto the substrate; and
a stage which includes a motor apparatus and positions the substrate,
wherein the motor apparatus includes:
a first member including a coil and a tooth-like salient pole, and
a second member opposed to said first member and including a magnetic material, and
the second member includes:
a base material having a surface on which convex portions and concave portions are periodically arranged,
a protective layer formed on surfaces of the convex portions and the concave portions, and
a filler filled in the concave portions in which the protective layer is formed.

* * * * *